United States Patent
Shao et al.

(10) Patent No.: US 8,843,695 B2
(45) Date of Patent: Sep. 23, 2014

(54) REVERSIBLE WRITE-PROTECTION FOR NON-VOLATILE SEMICONDUCTOR MEMORY DEVICE

(75) Inventors: Dan Shao, Shanghai (CN); Qingshan Hao, Shanghai (CN); Hongru Xu, Shanghai (CN)

(73) Assignee: Giantec Semiconductor Ltd. Inc., Shanghai (CN)

( * ) Notice: Subject to any disclaimer, the term of this patent is extended or adjusted under 35 U.S.C. 154(b) by 550 days.

(21) Appl. No.: 13/310,735

(22) Filed: Dec. 3, 2011

(65) Prior Publication Data

US 2013/0117499 A1 May 9, 2013

(51) Int. Cl.
*G06F 12/00* (2006.01)
*G11C 16/22* (2006.01)
*G06F 12/14* (2006.01)

(52) U.S. Cl.
CPC ............ *G11C 16/22* (2013.01); *G06F 12/1425* (2013.01)
USPC .................................. 711/103; 711/E12.103

(58) Field of Classification Search
None
See application file for complete search history.

(56) References Cited

U.S. PATENT DOCUMENTS

| | | | | |
|---|---|---|---|---|
| 5,428,579 A | * | 6/1995 | Robinson et al. | 365/230.03 |
| 5,749,088 A | * | 5/1998 | Brown et al. | 711/115 |
| 5,991,197 A | * | 11/1999 | Ogura et al. | 365/185.11 |
| 8,289,755 B1 | * | 10/2012 | Rahim et al. | 365/156 |
| 2008/0250509 A1 | * | 10/2008 | Ahvenainen | 726/34 |
| 2009/0210645 A1 | * | 8/2009 | Take et al. | 711/163 |
| 2010/0161878 A1 | * | 6/2010 | Chang | 711/103 |
| 2012/0110248 A1 | * | 5/2012 | Deng et al. | 711/103 |
| 2012/0265929 A1 | * | 10/2012 | Norman | 711/103 |
| 2012/0290771 A1 | * | 11/2012 | Radovcic | 711/103 |
| 2013/0067154 A1 | * | 3/2013 | Deng et al. | 711/103 |
| 2013/0159602 A1 | * | 6/2013 | Adams et al. | 711/103 |
| 2013/0318287 A1 | * | 11/2013 | Pyeon et al. | 711/103 |
| 2014/0019705 A1 | * | 1/2014 | Pyeon et al. | 711/170 |

* cited by examiner

*Primary Examiner* — Sean D Rossiter
(74) *Attorney, Agent, or Firm* — Yuan Qing Jiang

(57) ABSTRACT

A serial memory device having a non-volatile memory array including a plurality of memory blocks, one or more said plurality of blocks being capable of being placed in a locked or an unlocked state upon receiving designated lock or unlock signal sequences is provided. The unlock signal sequences comprises at least two sequential signal sequences: a first unlock sequence, which has 1 to 7 signal bits, is applied to one of address input pins or a logic low enabled write-protection input pin and a second unlock sequence follows the first unlock signal sequence and is applied to a serial data access pin. The memory device further comprising a control logic circuit block coupled to a write-protection circuit block to provide means to identify the designated lock and unlock signal sequences and to set a protection state in a security area.

11 Claims, 14 Drawing Sheets

US 8,843,695 B2

REVERSIBLE WRITE-PROTECTION FOR NON-VOLATILE SEMICONDUCTOR MEMORY DEVICE

FIELD OF INVENTION

The present invention relates to non-volatile semiconductor memory devices, more particularly to access control to the memory devices.

BACKGROUND OF INVENTION

Nonvolatile memory devices such as EEPROM (erasable programmable read-only memory) devices have low power consumption and have been widely used in applications of portable devices such as portable computers, personal digital assistant devices, digital cameras, and cellular phones. The nonvolatile memory devices have the capability of preserving data even when the power supply of the device is turned off Nonvolatile memory devices have also been developed with write protection features that reduce risks of mistakenly erasing or overwriting data stored in the memory devices. In general, in a portable device, both program code and system data, such as configuration parameters and other firmware, are stored in a segment of the memory device. In order to reliably retain important operational data and program code, it is necessary to have a protection mechanism on the memory device to prevent unintentional erasing or corrupting the system data.

Typically, a conventional EEPROM memory chip may have three different types of protection methods. One is Permanent Software Write Protection (PSWP) which is a non-reversible protection for a segment of the data array of an EEPROM device that can be set permanently by the software. The other part of the data array keeps to be available for write operations. The PSWP method is very reliable to ensure data protection. However, once the permanent software write protection is enabled, by sending a special command to the device, it cannot be reversed. The system data is permanently stored in the given segment and no changes can be made. This method imposes limitations of flexible system accessibility for error correction, system upgrade, and/or system improvement.

Another protection method is hardware write protection which is realized by connecting the WP (write-protection input pin) (protect pin) pin to VCC (power supply voltage) which will protect the array from write or erase operation, regardless of whether or not the software write protection has been enabled. The difference between software write protection and the hardware protection is that the second one (hardware) uses the WP pin of the EEPROM device to protect the entire data array. In addition, in software protection, once a PSWP command is issued it cannot be reversed while the hardware write protection can be disabled by tying the WP pin to VSS (Ground voltage) potential that is the Ground.

As manufacturers produce these memory devices for electronics product developers, some developers prefer to have a flexibility to change the contents while producing the product. Once the product is to be released to the end user, the content of the memory chip should be locked. To meet this requirement, there are memory devices, such as Atmel EEPROM AT34C02B, developed to have a reversible Software Write Protection (RSWP). This is realized by sending a command to the device which programs the reversible write protect register. However, either write protection or reversible write protection must be done with combination biasing on various pins while sending a special command. When a product is already wired on a motherboard of the system, applying biasing is not convenient for product developers.

In view of the above problems, there is a need to develop a memory device with a convenient yet reliable reversible software write protection which allows for product developers to modify the system code at will and enable reliable system protection for end users.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION OF THE INVENTION

Figure 1:
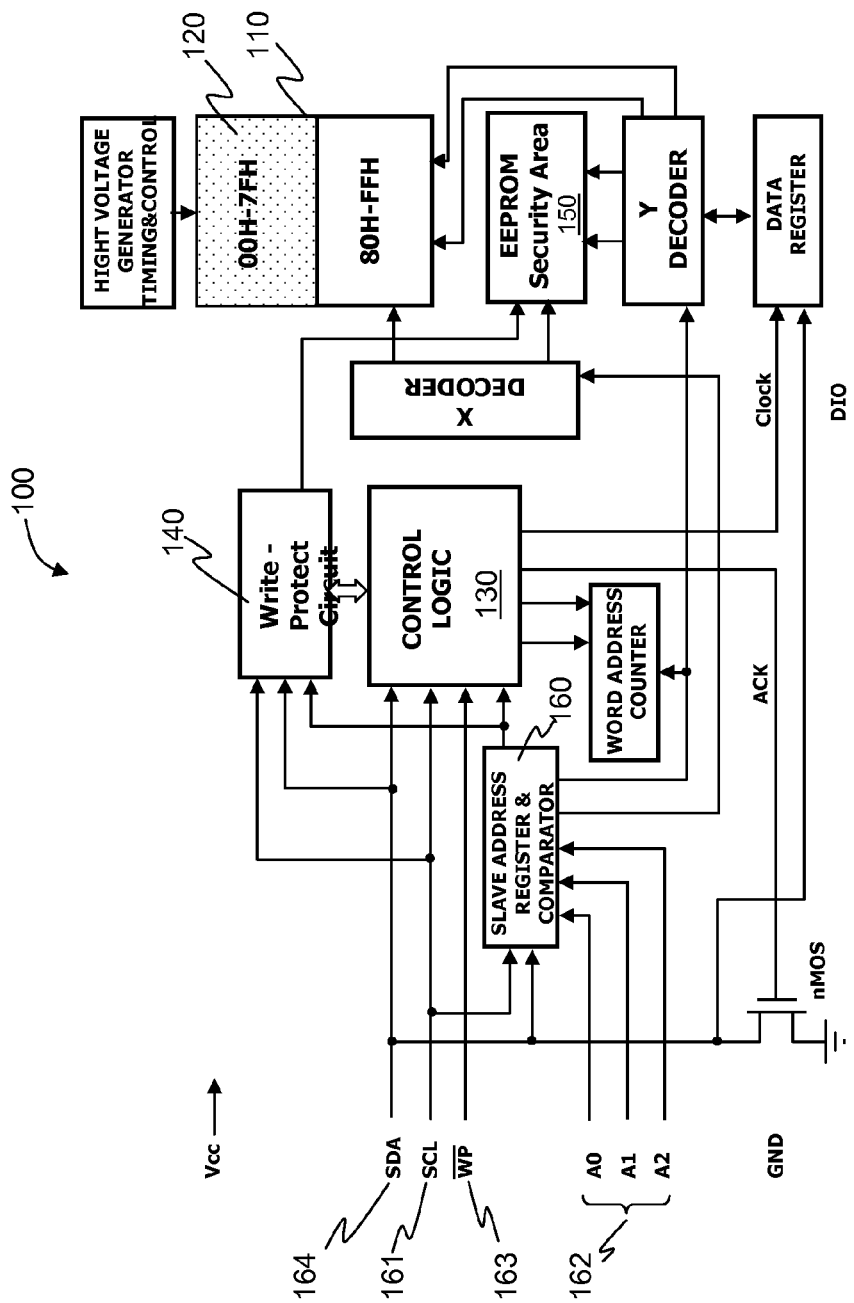
FIG. 1 is a block diagram of a non-volatile memory device system according to an embodiment of the present invention.

The present invention provides a nonvolatile memory device and related methods that allow its memory blocks to be protected, referred as locked, from being inadvertently erased and programmed, or unprotected (unlocked) by issuing software instructions.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one ordinary skill in the art and having possession of this disclosure, are to be considered within the scope of the invention.

FIG. 1 is a simplified block diagram illustrating an example of a non-volatile memory device with a serial interface in accordance with one embodiment of the present invention. Herein, a non-volatile memory device is a memory device that is not erasable unintentionally even when its electrical power supply is turned off A memory device with a serial interface is also referred as a "serial memory device". A serial EEPROM (Electrically Erasable Programmable Read-Only Memory) typically operates in three phases: Operational Codes (OP-Code) Phase, Address Phase and Data Phase. The OP-Code is usually the first 8-bits input to a serial input pin of the EEPROM device; followed by 8 to 24 bits of addressing depending on the depth of the device, then data to be read or written.

The memory device 100 has a number of input pins: SCL (161) is a serial clock input to clock input signals; SDA (164) is a serial data pin used to transfer data into and out of the device; $\overline{WP}$ (163) is a logic low enabled write-protection input pin; A2, A1, and A0 pins (162) are selected inputs used to set the address.

With reference to FIG. 1, the non-volatile serial memory device 100 includes an EEPROM memory array 110 which comprises plurality memory blocks. Each block has an address associated with it. One or more said plurality blocks 120 can be placed in a locked (protected) state or an unlocked (unprotected) state. For example, memory blocks 00H through 7FH (the lower half of the memory blocks), can be the designated blocks that can be write-protected (or locked).

The memory device 100 includes a security area 150 which stores an access control status. For example, when the access control status is "1", erase and program operation to memory blocks 120 is prohibited.

Figure 2:
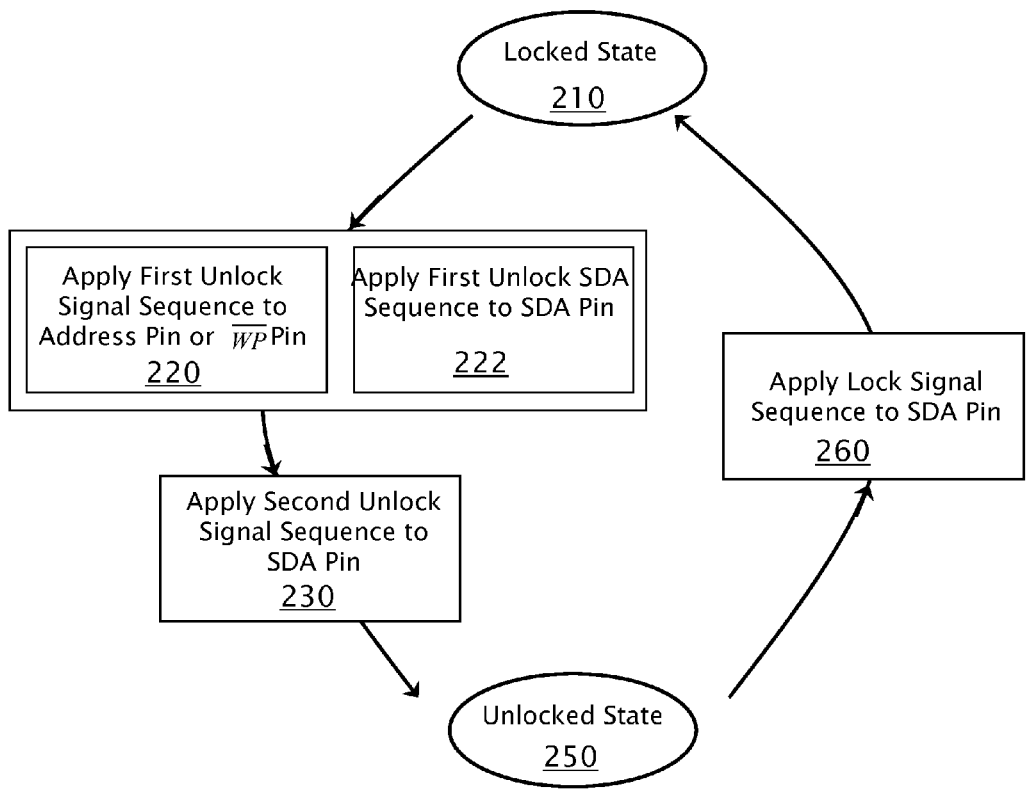
FIG. 2 illustrates state transitions between locked (protected) and unlocked (unprotected) states according to embodiments of the present invention.

FIG. 2 illustrates transitions between locked and unlocked state of the memory device 100. The upper half of the memory blocks 120 can be in either locked state 210 or unlocked state 250. When the memory blocks is in the locked state 210, the access control status is "1" and erase or write operations to these memory blocks are prohibited. The locked state 210 can be switched to the unlocked state 250 by changing the access control status from "1" to "0". In order to prevent inadvertently unlock the protected memory blocks, various methods and circuits are designed to unlock the state 210, which will be detailed in the following.

As shown in FIG. 2, two designated unlock signal sequences are applied to the memory device in order to change the protection state of the memory device from the locked to the unlocked state. A first designated unlock signal sequence 220 is applied to one of the address pins 162, labeled as A0 though A2. In an alternative embodiment, the first unlock signal sequence is applied to a logic low enabled write-protection input pin ($\overline{WP}$),163. This sequence is followed by a second designated unlock signal sequence 230 applied to the serial data access pin (SDA) 164.

One of the advantages of applying the first unlock signal sequence to one of the address pins or $\overline{WP}$ pin is to improve the reliability of the unlock process. For a typical serial memory device, the address pins or $\overline{WP}$ pin maintain a constant logic level (logic high or low) most of the time, when signals are input via SDA pin. As the first unlock signal sequence, for example "0101", is applied to one of these input pins, the logic circuit of the memory device can clearly distinguish this designated signals from other sequence signal inputs or system noise/error.

In an alternative embodiment as shown in FIG. 2, a first designated unlock SDA signal sequence (222) can be applied on the SDA pin during the same time period as the first designated unlock signal sequence (220) is applied to one of the address pins 162 or $\overline{WP}$ pin, 163.

Figure 3A:
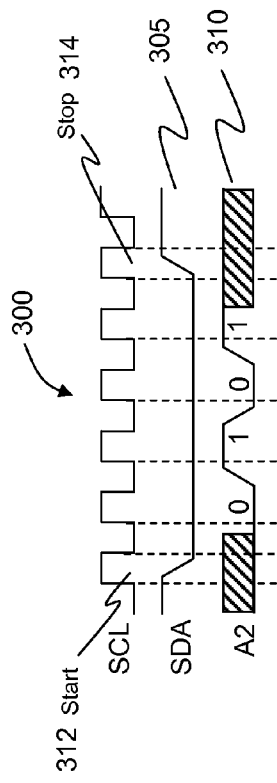
FIG. 3A and FIG. 3B show examples of unlock signal sequences.
Figure 3B:
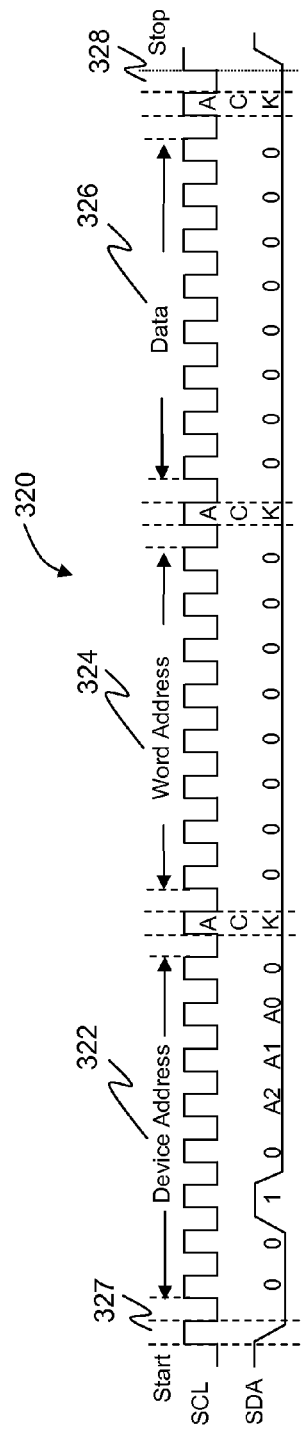

FIG. 3A and FIG. 3B provides an example of the first 300 and second 320 designated unlock signal sequences. FIG. 3A shows the first unlock signal sequence 310 comprising 4 signal bits: 0101, which are applied to A2 address pin. During this period, the first designated unlock SDA signal sequence (305), 0000 is applied on SDA. According to an alternative embodiment of the present invention, the first unlock signal sequence may comprise any number of signal bits between 1 to 7. One advantage of having less than 8 signal bits for the first unlock sequence is to further improve the reliability of the unlock process. As described earlier, the OP-Code is usually the first 8-bits input on a serial input pin of the EEPROM device. In contrast, during the input of the first unlock sequence, the SDA pin receives signals less than 8 bits. The logic circuits of the memory system will easily recognize that this input (305) is not a valid conventional input in a conventional device. In combination with the input on A2 address pin, the system can reliably determine if this is indeed the first unlock signal sequence.

In the example shown in FIG. 3A, the first designated unlock SDA signal sequence applied on SDA is "0000". In an alternative embodiment, this sequence applied on SDA pin can be any signal sequence which has the same number of bits as the one applied on A2 pin. For example, an alternative designated sequence 305 can be "1001".

As shown in FIG. 3A, the first designated unlock SDA signal sequence 305 applied on SDA pin also includes start bit (312) and stop bit (314). The memory system recognizes the start and stop bit by determining if there is a signal change when the clock signal SCL is at logic high. For example, when the clock signal is high during which the signal on SDA changes from low to high, a start bit is recognized. On the other hand, if the SDA signal changes from high to low during clock signal high, a stop bit will be recognized.

As shown in FIG. 2, immediately following the first unlock signal sequence, a second designated signal sequence 320 is applied to SDA pin. FIG. 3B provides an example of the second unlock signal sequence which consisted of 3 bytes: first byte 322, "0,0,1,0,$A_2$,$A_1$,$A_0$,0", second byte 324 of word address, and third byte 326 of data. In addition, there are start bit 327 and stop bit 328 at the beginning and the end of the sequence respectively. One advantage of using two unlock signal sequences is to further improve the reliability of the unlock process. In an alterative embodiment, multiple sequences such as three or four sequences can be used to unlock the protection state.

In addition to multiple unlock sequences, the reliability of an unlock process relies on the order of these sequences. For example, if the second unlock signal sequence is received before the first unlock signal sequence, the unlock process will not happen. The detailed methods and means of these processes will be described below.

Figure 3C:
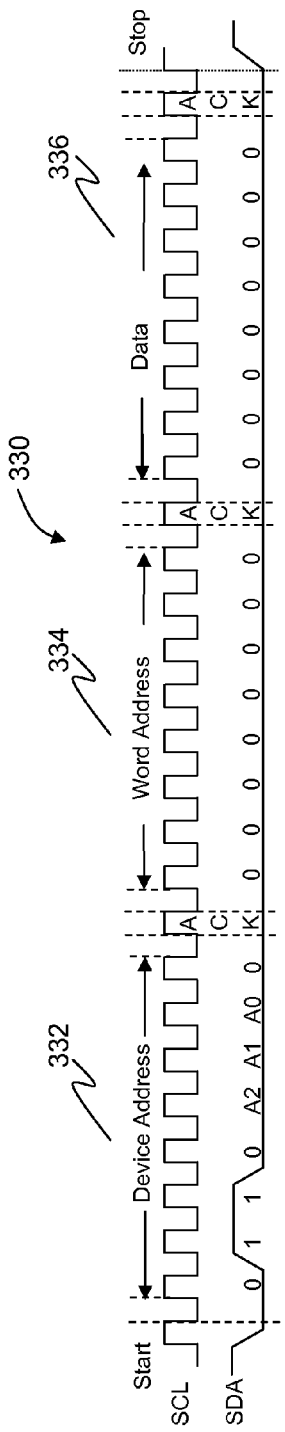
FIG. 3C shows an example of a lock signal sequence.

Referring to FIG. 2, when the memory blocks 210 is in the unlocked state 250, the memory blocks can be accessed by read, write, or erase operation. After the memory blocks have been programmed, the unlocked state 250 can be switched to the locked state 210 by issuing a lock signal sequence 260 to the serial data access pin 164. An example of the lock signal sequence is shown in FIG. 3C, wherein the lock signal sequence 330 comprises first byte 332, "0,1,1,0,A2,A1,A0, 0", second byte 334 of word address, and third byte 336 of data. In this example, both word address and data are set to logic low (zero).

In order to reliably lock and unlock a non volatile memory device to prevent inadvertently write or erase operations, digital logic circuits are developed according to various embodiments of the present invention. Referring back to FIG. 1, the memory device 100 includes a slave address register & comparator 160 that is coupled to address input pins 162. Although the address input pins are primarily used to provide address signals, these pins are used for input of the first unlock signal sequence 220 according to one embodiment of the present invention.

The memory device includes a control logic block 130 that is coupled to the slave address register 160, and SCL and SDA input pins. The control logic block includes a state machine (not shown) to control memory device operation.

Figure 4A:
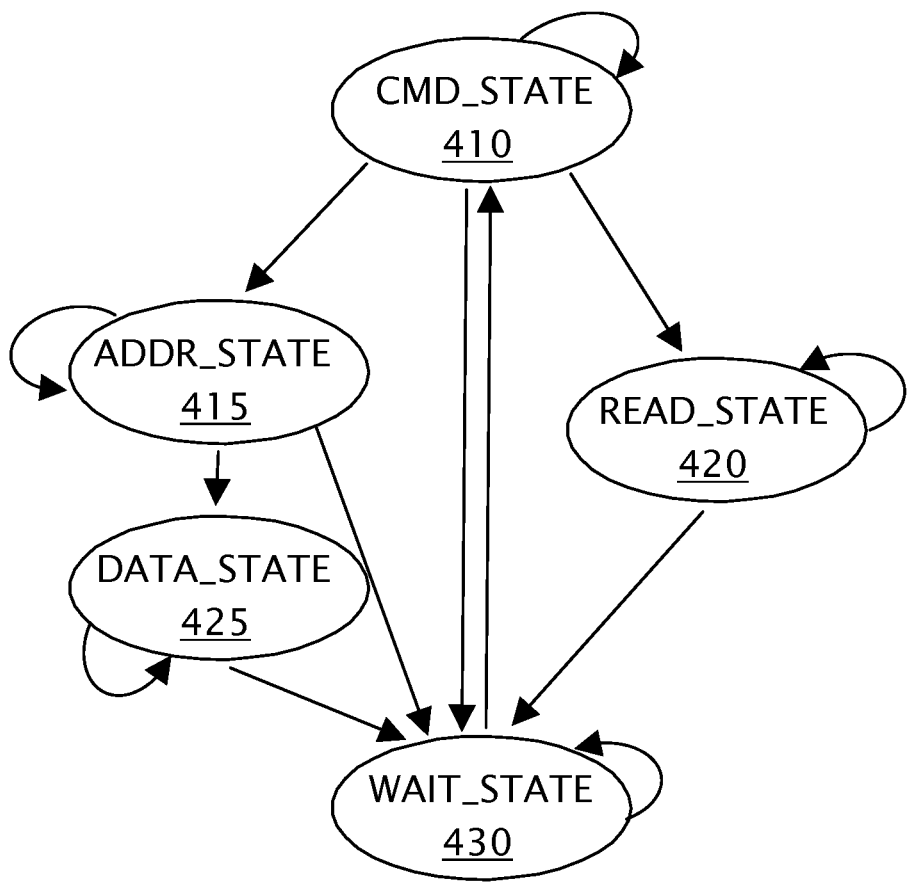
FIG. 4A is a transition diagram of a state machine.

FIG. 4A shows transition diagrams of states of the state machine 400. Command state 410 (CMD_STATE) is for command input. At this state, signals decoded from SDA are interpreted as a command. When the memory system is started, it is at CMD_STATE for receiving a command. If the command signal is a valid 8 bit signal sequence, the state machine will change to address state (ADDR_STATE 415) for receiving address data or read state (READ_STATE 420) for reading the memory data. However, if the command is an invalid signal sequence, for example a sequence of less than 8 bit signals, the machine will be placed at the wait state (WAIT_STATE 430) to wait for the start bit of the next signal sequence. The WAIT_STATE of the state machine primarily deals with situations when machine is busy and cannot take external input signals or the system receives invalid signal sequences.

At the address state (ADDR_STATE), if the address signal sequence is a valid 8 bit sequence, the state machine will change to data state (DATA_STATE 425) for receiving data to be stored in memory location indicated by the address signal sequence.

Figure 4B:
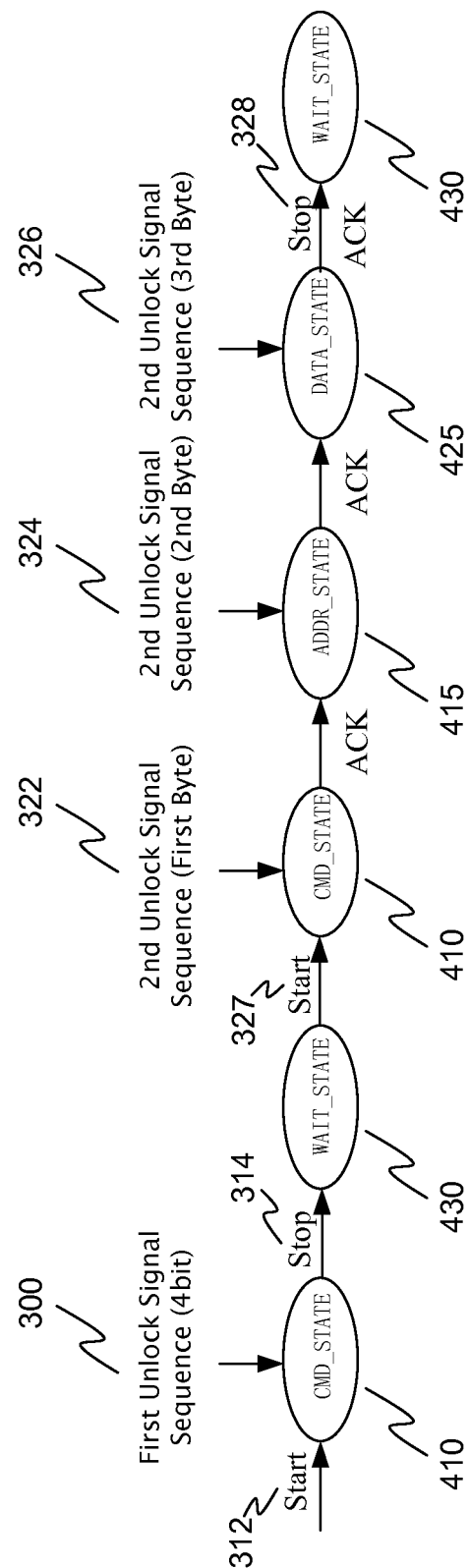
FIG. 4B shows an example of a transition sequence of the state machine according to an embodiment of the present invention.

FIG. 4B provides a detailed description of transitions of the state machine during inputs of the first and second designated signal sequences. At a starting stage, the machine is at CMD_STATE, the first unlock signal sequence such as 310 is asserted on A2 address pin. During this period, 0000, the first designated unlock SDA signal sequence (305) is asserted on SDA pin. Since the sequence 305 consists of only 4 bit signals, the state machine regards it as an invalid sequence and the machine state changes to WAIT_STATE. When the system receives the start bit 327 of the second unlock sequence on SDA pin, the state machine is at CMD_STATE again.

As shown in FIG. 4B, during second CMD_STATE, a second unlock signal sequence 320 arrives from SDA pin. The first byte 322 of the second unlock signal sequence is a valid command sequence and therefore the state machine moves to ADDR_STATE to receive address information. The second byte 324 of the second unlock signal sequence is a valid address signal sequence and the state machine changes to DATA_STATE to receive data. After DATA_STATE, the machine returns to WAIT_STATE, during which logic circuits are processing these signal sequences.

The memory device system 100 shown in FIG. 1 includes a protection circuit block 140 implementing logic circuits to determine signal sequences from the input pins and signals from logic circuit block 130.

Figure 5:
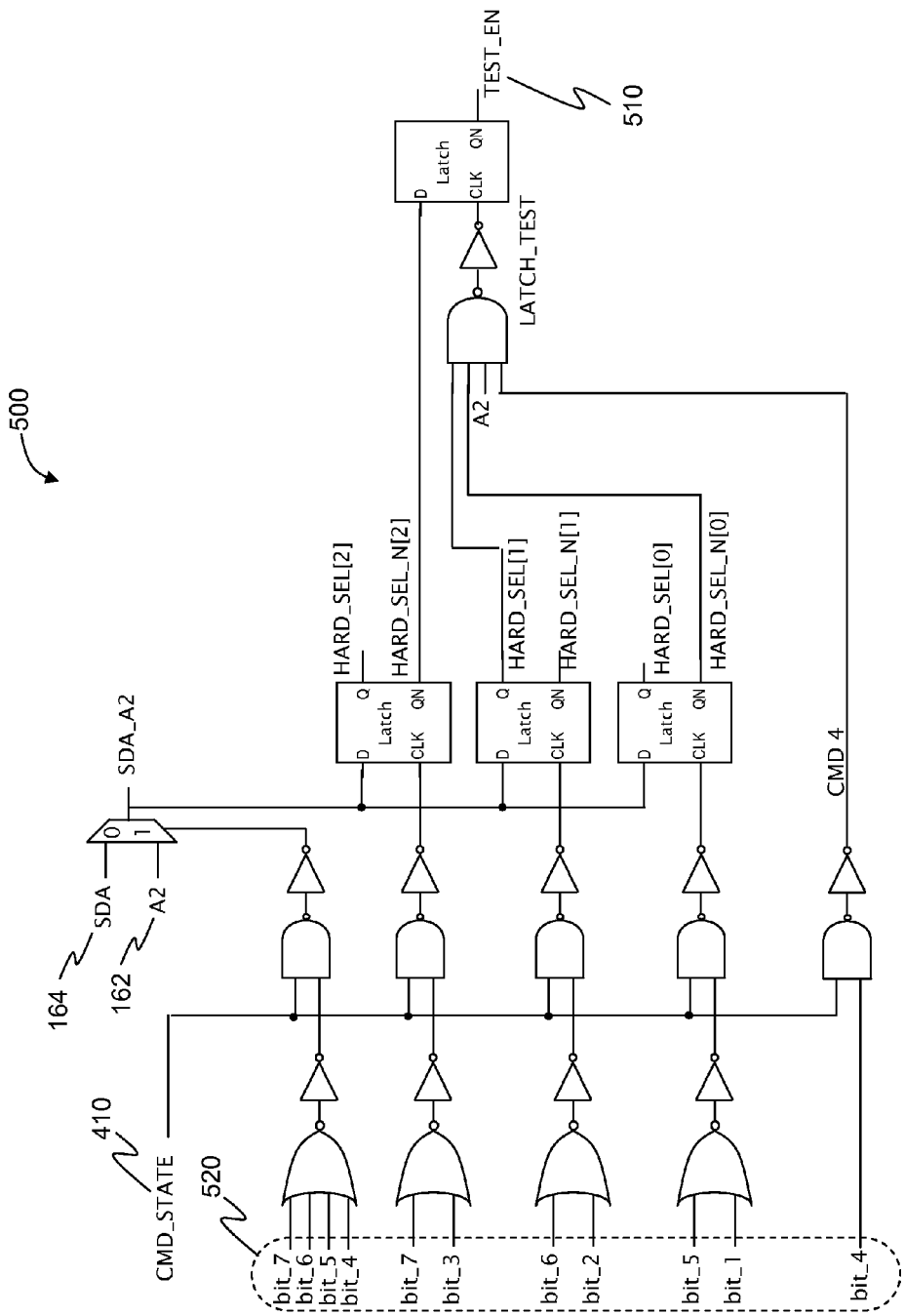
FIG. 5 is a logic circuit diagram illustrating an example of processing an unlock signal sequence in accordance with one embodiment of the present invention.

FIG. 5 provides an example of means for identifying whether a designated first unlock signal sequence is asserted on A2 address pin. In this example, logic circuit 500 is constructed in the Write-Protect circuit block 140. In FIG. 5, inputs 520 are from serial clock pin SCL, 161. Herein the definition of the order of clock bit is from 7 to 0. The first designated unlock sequence 310 is clocked as 0 (bit 7), 1 (bit 6), 0 (bit 5), 1 (bit 4). When CMD_STATE is set as "1" and the sequence 0101 is asserted on A2 pin, a logic high ("1") is generated on the output of the latch test, TEST_EN, 510. After asserting 0101 on A2 pin, A2 resumes the nominal function as an address pin.

Figure 6:
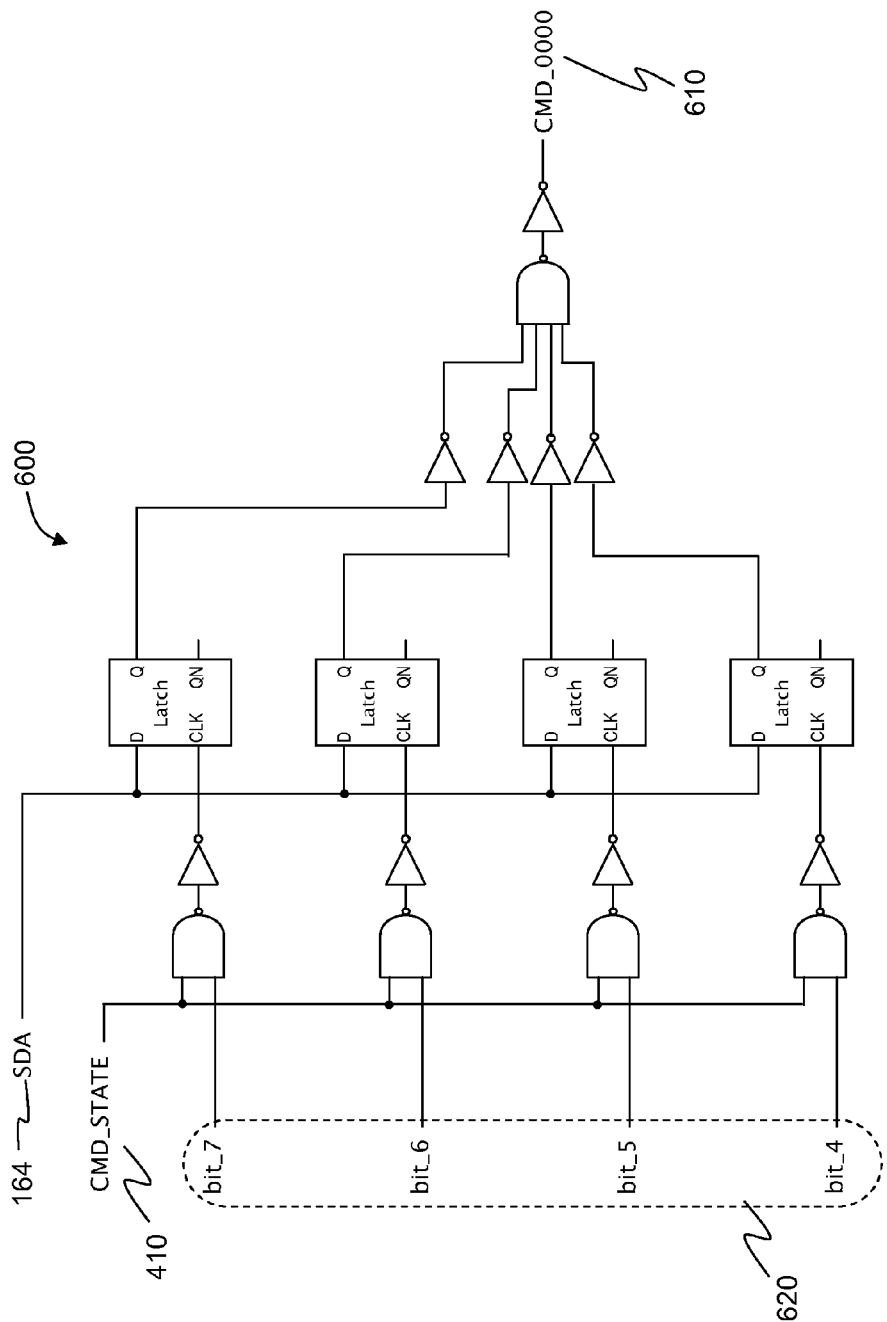
FIG. 6 is a logic circuit diagram illustrating an example of processing an unlock signal sequence in accordance with one embodiment of the present invention.

FIG. 6 provides an example of means for determining if the first designated unlock SDA signal sequence 305 is applied on the SDA pin during the input of the first unlock signal sequence on A2 pin. The logic circuit 600 shown in FIG. 6 is constructed in the logic control circuit block 130 (FIG. 1). In this example, when the sequence 310 is asserted on A2 pin, sequence "0000", 305 is asserted on SDA pin 164. In circuit 600, inputs 620 are clock bits from serial clock pin SCL, 161. When CMD_STATE is set as "1" and the sequence 0000 is asserted on SDA pin, a logic high ("1") is generated on the output of the latch test, CMD_0000 (610).

Figure 7:
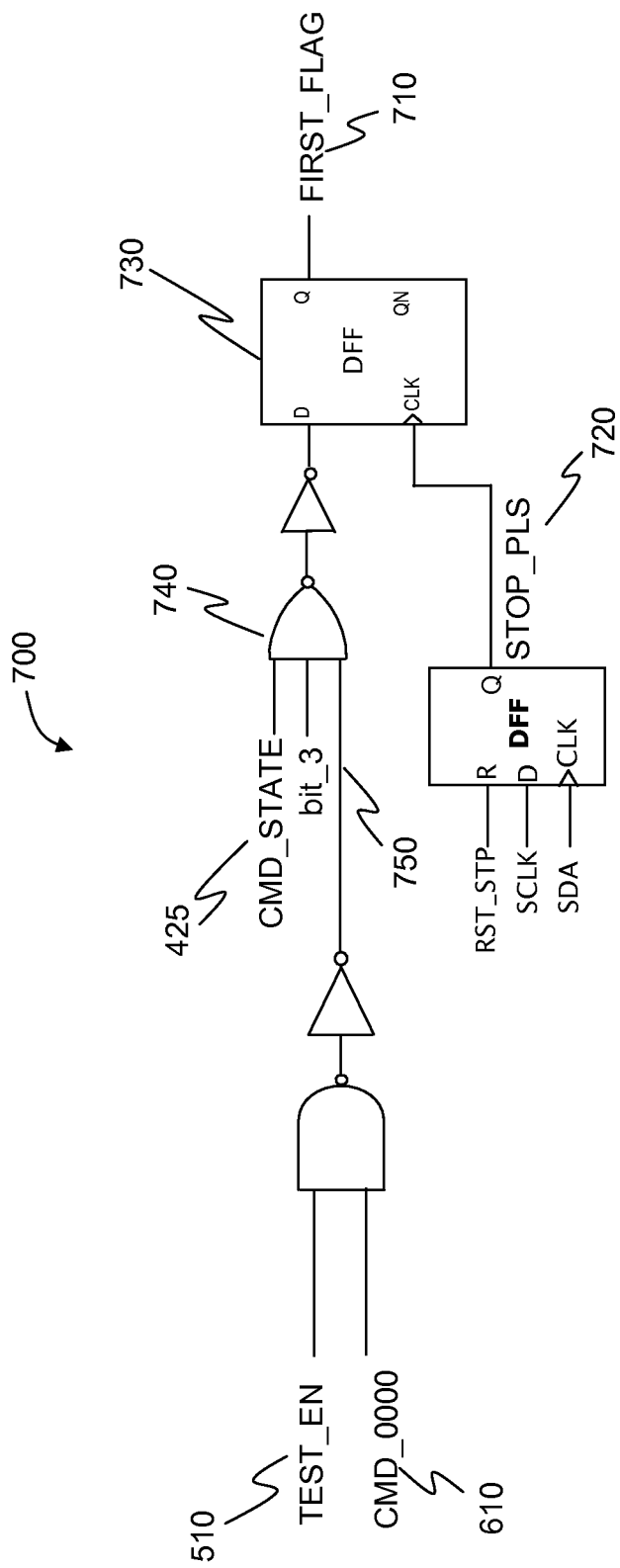
FIG. 7 is a logic circuit diagram illustrating an example of generating a command signal in accordance with one embodiment of the present invention.

In FIG. 7, logic circuit 700 takes TEST_EN (510) and CMD_0000 (610) as input. If both TEST_EN and CMD_0000 are logic high, "1", a logic high ("1") is generated on the output of the latch test, FIRST_FLAG (710).

Logic circuit 700, not only identifies the designated first unlock signal sequence applied on A2 and SDA, it also provides means, in connection with circuit 900, to determine if the first designated unlock sequence is indeed followed by the second designated unlock sequence. As shown in FIG. 7, when both TEST_EN and CMD_0000 are logic high, "1", one of the input pins, 750, of the NAND Gate 740 is high ("1"). Since the other two inputs of the NAND gate 740 are CMD_STATE and clock bit_3, only when the state machine is at the command state and when the 5th clock bit arrives, the logic "1" on pin 750 can lead to a logic "1" on the input, D, of the D flip-flop 730. The Q output of the D flip-flop takes on the state of the D input at the moment of a positive edge at the signal of STOP_PLS 720, which is the front edge of stop bit 314 of the first designated unlock SDA signal sequence. The time duration of the stop bit 314 is the same time duration of the 5th clock bit. Therefore, logic circuit 700 ensures that only the first designated signal sequence 300 can generate logic "1" on the output of D flip-flop 730. This Q value ("1") of FIRST_FLAG 710 will be maintained until the next stop bit which is stop bit 328 at the end of the second unlock sequence.

Figure 8:
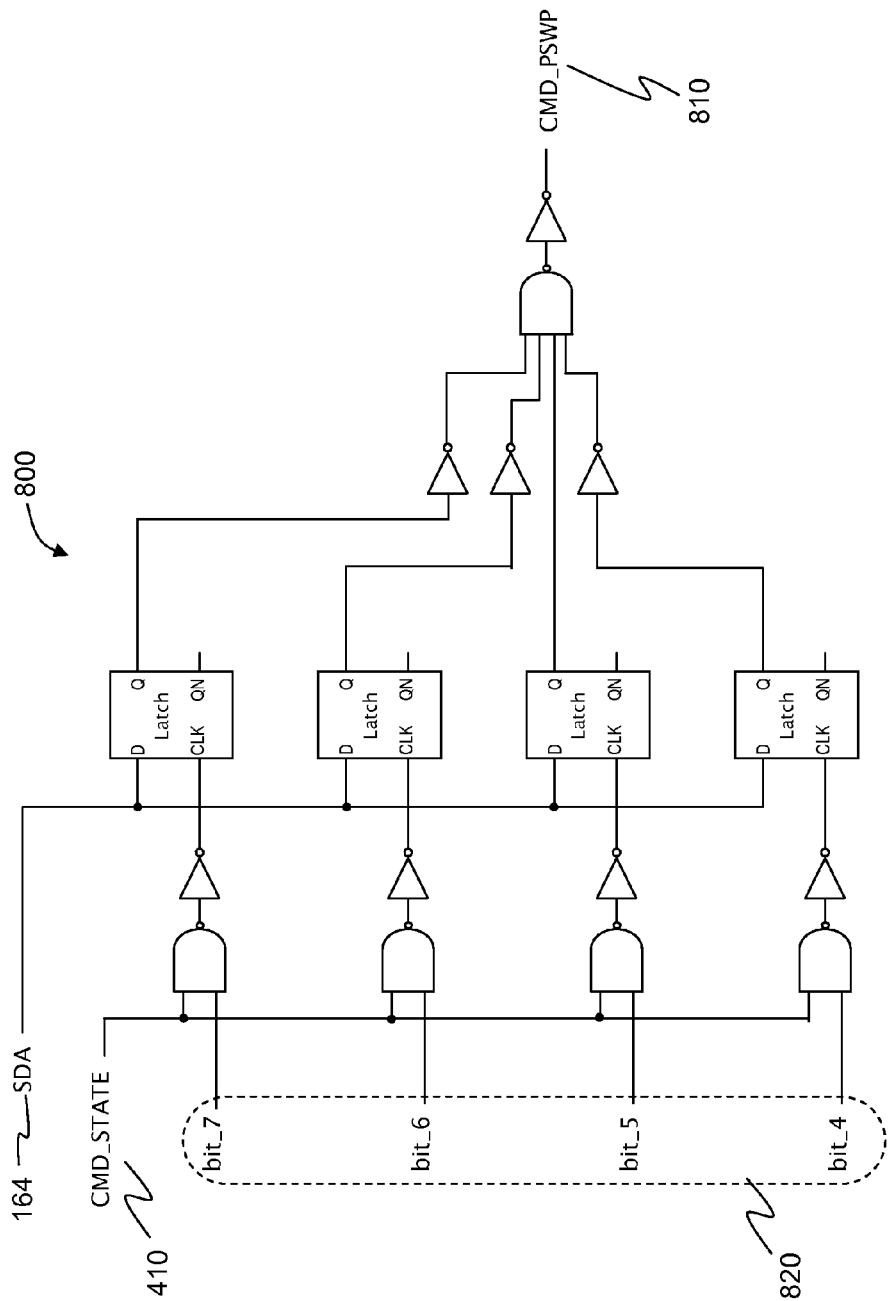
FIG. 8 is a logic circuit diagram illustrating an example of processing an unlock signal sequence in accordance with one embodiment of the present invention.

FIG. 8 is an example of means for identifying whether a designated second unlock signal sequence 320 is asserted on SDA pin. The logic circuit 800 shown in FIG. 8 is constructed in the logic control circuit 130 (FIG. 1). In this circuit, inputs 820 are clock bits from serial clock pin SCL, 161. When CMD STATE is set as "1" and the sequence 0010 is asserted on SDA pin, a logic high ("1") is generated on the output of the latch test, CMD_PSWP (810). This "1" state will be maintained until the state machine is at CMD_STATE again.

Figure 9:
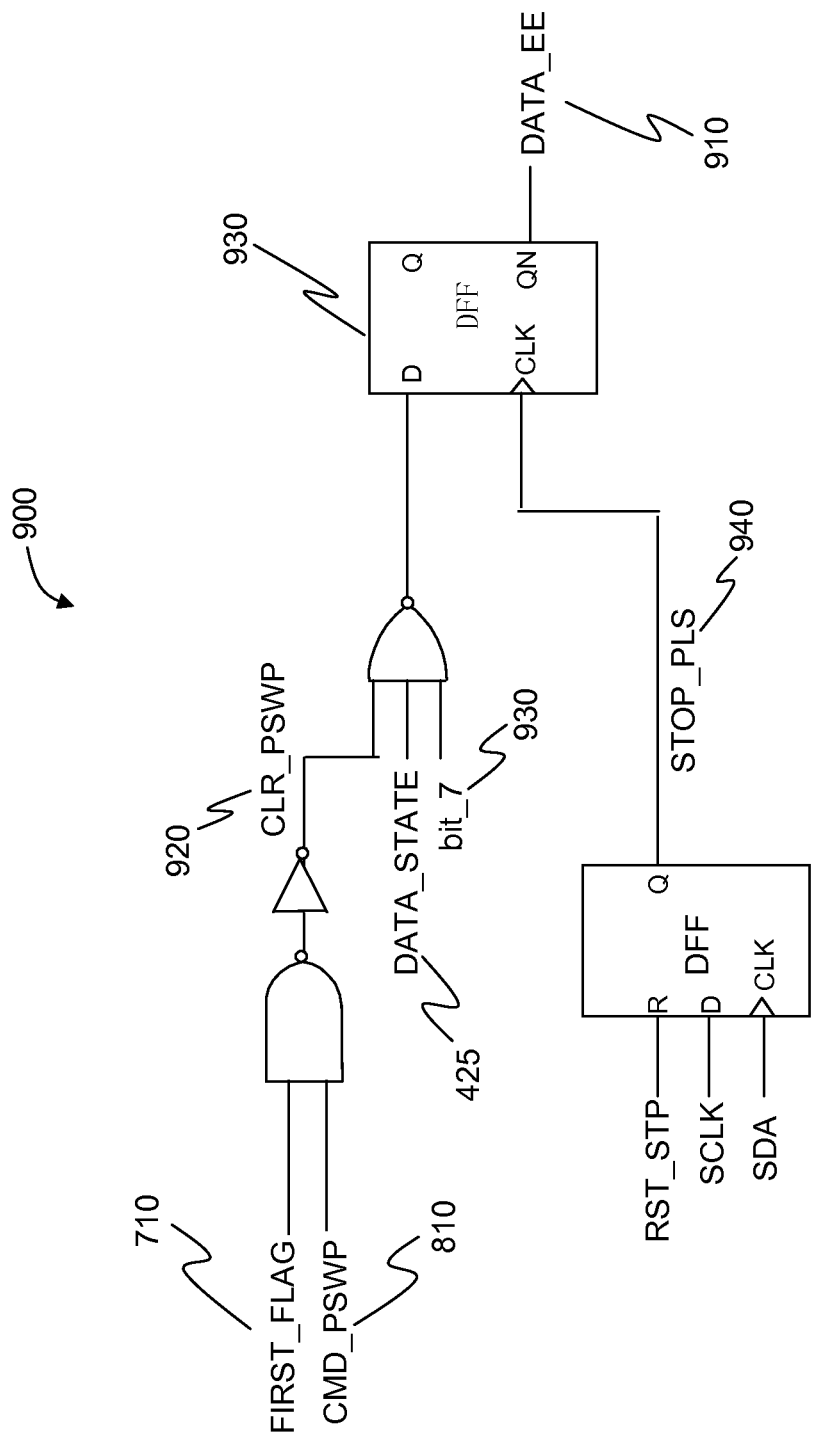
FIG. 9 is a logic circuit diagram illustrating an example of generating a command signal in accordance with one embodiment of the present invention.
Figure 10:
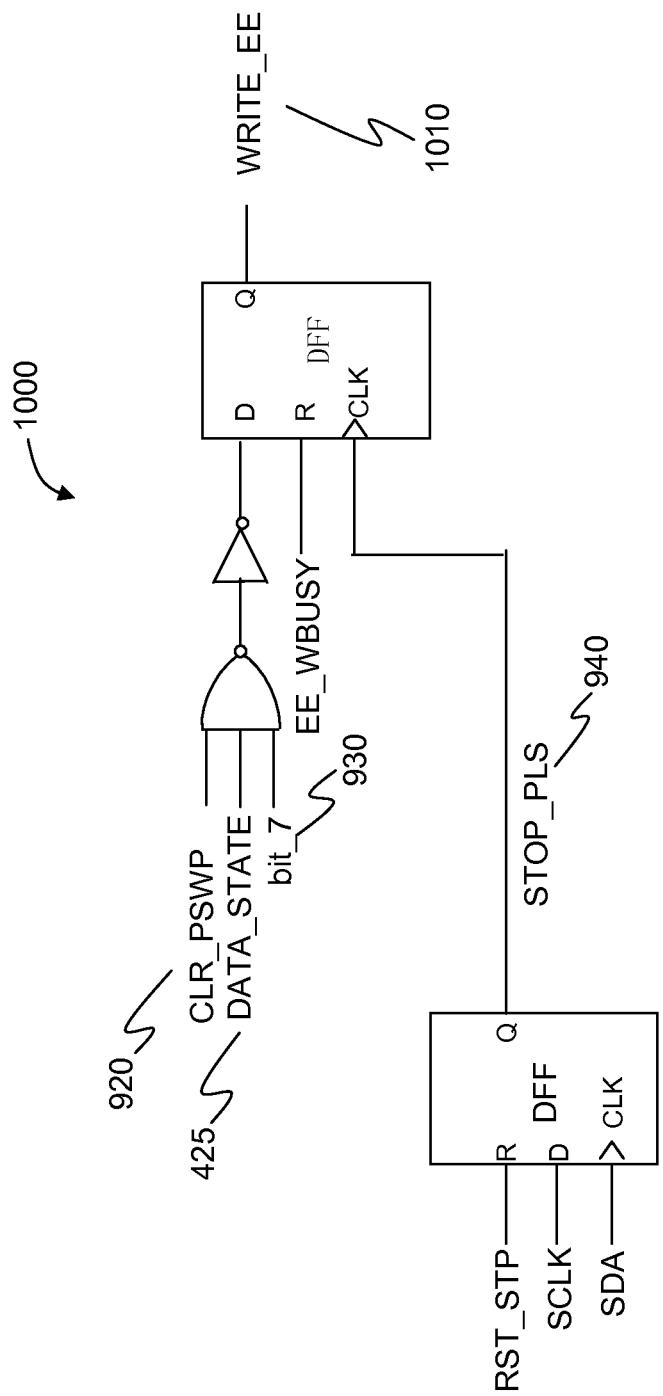
FIG. 10 is a logic circuit diagram illustrating an example of generating a command signal to alter the access control status in accordance with one embodiment of the present invention.

The write-protection circuit block 140 further comprises logic circuits 900 and 1000 shown in FIG. 9 and FIG. 10 respectively. In FIG. 9, FIRST_FLAG (710, the output of logic circuit 700) and CMD_PSWP (810, the output of logic circuit 800) are the inputs of logic circuit 900. As described earlier, FIRST_FLAG is "1" until the end of the second unlock sequence and CMD_PSWP is "1" until the state machine is at CMD STATE (referring to FIG. 4B). Therefore, if the second unlock sequence follows the first unlock sequence, the state, CLR_PSWP 920 is "1". CLR_PSWP 920 maintains "1" state when the state machine is at DATA_STATE 425. As the result, the input, D, of the D flip-flop 930 is "0". The Q output of the D flip-flop takes on the state of the D input at the moment of a positive edge at the signal of STOP PLS 940, which is the front edge of stop bit 328 of the second unlock sequence. This Q value, DATA_EE 910 will set the access control status as "0" (unlock) in the security area 150.

Circuit 1000 shown in FIG. 10 takes FIRST_FLAG and CMD_PSWP as its input. The output WRITE_EE 1010 will be "1" when CLR_PSWP 920 maintains "1" when the state machine is at DATA_STATE 425. When WRITE_EE is "1", the value of DATA_EE can be written into the security area to change the access status.

In a situation of wrong order of the first and second sequence, circuit 700 prevents the unlock process happening. For example, if a valid second unlock sequence arrives on SDA pin first, FIRST_FLAG (710) cannot be "1" since the $5^{th}$ clock bit does not overlap with the stop bit 328.

In a situation if FIRST_FLAG (710) and CMD PSWP are both "1" by error, the state machine has to be at DATA_STATE in order to set "0" and "1" for DATA EE and WRITE_EE respectively. This restriction further ensures the reliability of the unlock process.

Figure 11:
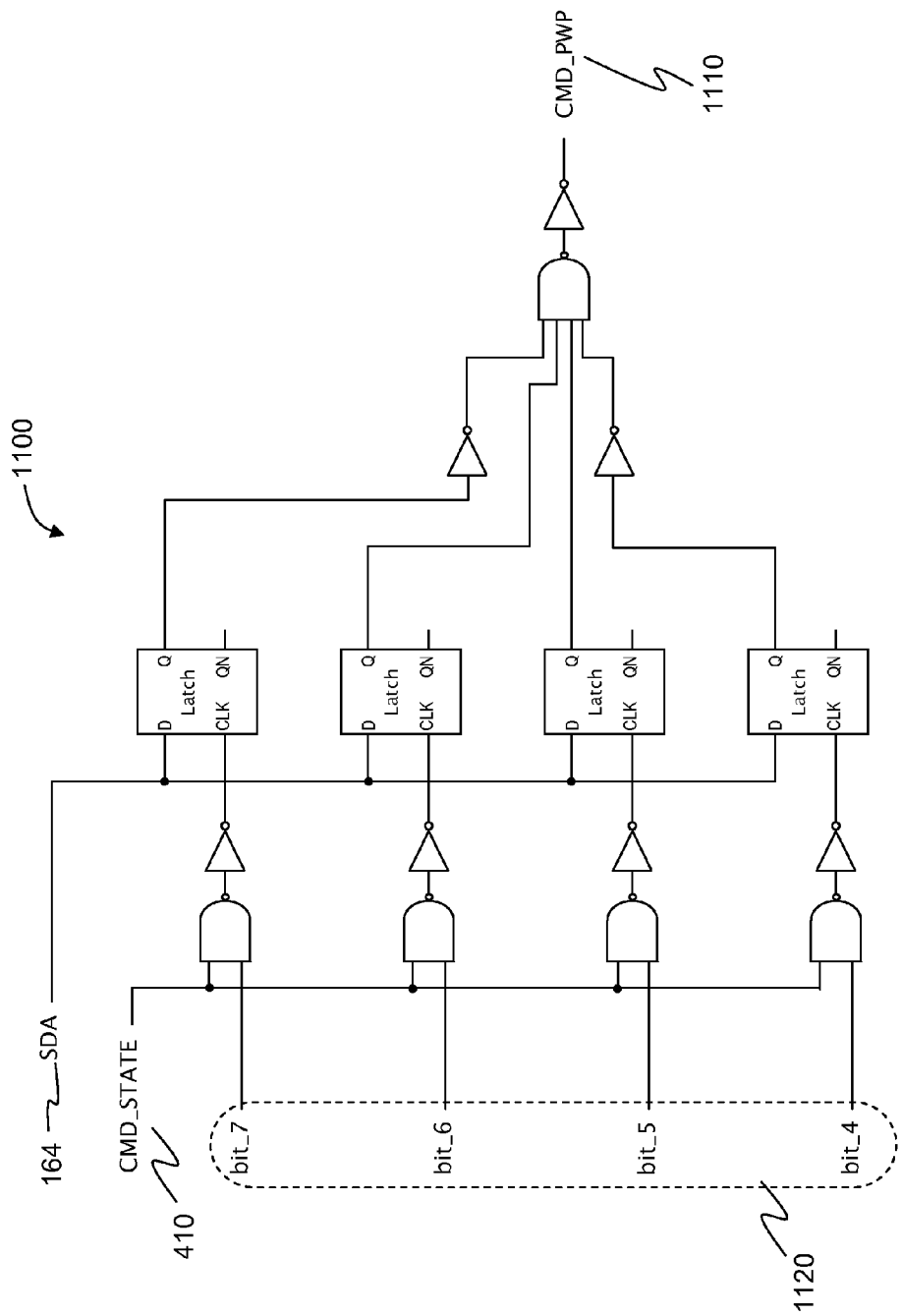
FIG. 11 is a logic circuit diagram illustrating an example of processing an unlock signal sequence in accordance with one embodiment of the present invention.

FIG. 11 provides an example of means for identifying whether a designated lock signal sequence is asserted on SDA pin. In this example, logic circuit 1100 takes inputs from serial clock bit_7 through bit_4 (1120), CMD STATE (410) of the state machine, and signal sequence from SDA (164). For the example shown in FIG. 3C, the first 4 bits of the first byte 332 of the designated lock signal sequence 330 is "0110". When this signal sequence is asserted on SDA pin and the state machine is at CMD_STATE, CMD_PWP (1110), the output of circuit 1100, is logic "1".

Figure 12:
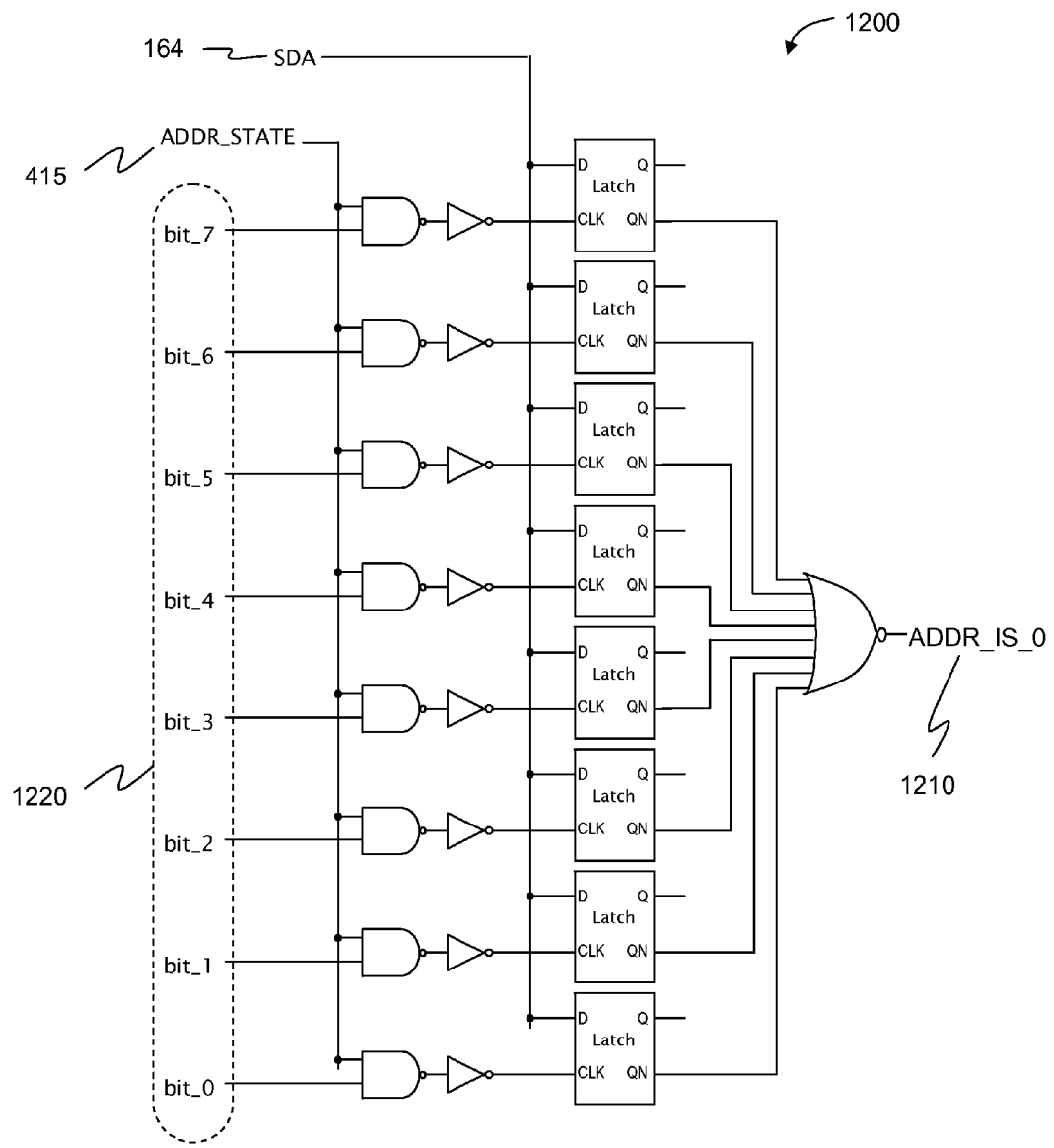
FIG. 12 is a logic circuit diagram illustrating an example of processing an unlock signal sequence in accordance with one embodiment of the present invention.

FIG. 12 shows an example of means for identifying if the second byte (address) of the designated lock or unlock signal sequences (324 or 334) is "00000000". In logic circuit 1200, the second byte signals are latched by the clock bits (1220) and by ADDR_STATE (415) of the state machine. During this time frame, if the second byte signals are "00000000", ADDR_IS_0 (1210), the output of circuit 1200, is logic "1".

Figure 13:
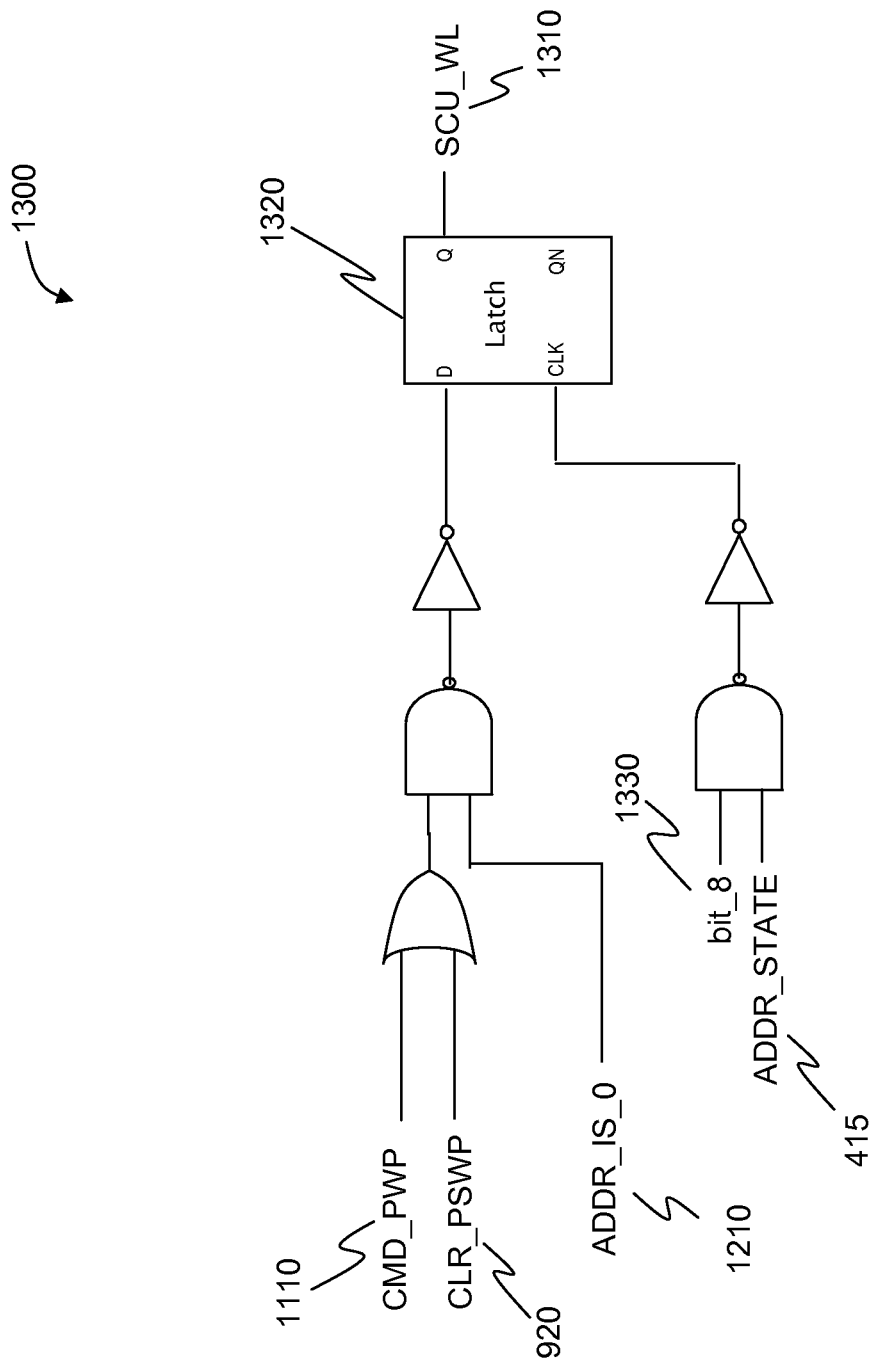
FIG. 13 is a logic circuit diagram illustrating an example of generating a command signal in accordance with one embodiment of the present invention.

FIG. 13 is an example of means for determining if a signal sequences from SDA pin is targeted to the security area (150). When ADDR_IS_0 (1210) is "1" and when either CMD_PWP (1110) or CLR PSWP (920) is "1", the input D of the latch logic circuit 1320 is logic "1". The Q output of the latch 1320 takes on the state of the D input when the state machine is at ADDR STATE (415) and the $8^{th}$ clock bit arrives. This Q value, SCU_WL (1310) sets the security area as the address for the logic value of DATA_EE (910, FIG. 9) to be written under the permission that WRITE_EE (1010, FIG. 10) is logic "1".

One can recognize that changes may be made in the above methods and device structures without departing from the scope thereof. For example, the state transition between locked to unlocked state shown in FIG. 2 can be performed by three or more designed unlock signal sequences. Another example of an alternative embodiment is to apply the first unlock sequence 220 to a logic low enabled write-protection port ($\overline{WP}$) shown in FIG. 1. It should thus be noted that the matter contained in the above description and/or shown in the accompanying drawings should be interpreted as illustrative and not in a limiting sense. Accordingly, the invention is intended to embrace all other such alternatives, modifications, and variations that fall within the spirit and scope of the appended claims.

What is claimed is:

1. A serial memory device comprising:
a non-volatile memory array including a plurality of memory blocks, one or more said plurality of blocks being capable of being placed in a locked or an unlocked state upon receiving designated lock or unlock signal sequences respectively; wherein the unlock signal sequences comprises at least two sequential signal sequences: a first unlock sequence, which has 1 to 7 signal bits, is applied on one of address input pins or a logic low enabled write-protection input pin ($\overline{WP}$); wherein a second unlock sequence follows the first unlock signal sequence and is applied to a serial data access pin;

the memory device further comprising a control logic circuit block coupled to a write-protection circuit block providing means for identifying the designated lock and unlock signal sequences and to set a protection state in a security area.

2. The serial memory device of claim 1, wherein the control logic circuit block and write-protection circuit block provide means for identifying a designated order of the first and second unlock signal sequences.

3. The serial memory device of claim 1, wherein the first unlock signal sequence consists of 4 signal bits.

4. The serial memory device of claim 1, wherein the unlock signal sequences further include a first SDA unlock signal sequence applied on the SDA pin during the same clock sequence period as the first unlock signal sequence applied to one of the address input pins or a logic low enabled write-protection input pin ($\overline{WP}$); wherein the first SDA unlock signal sequence has the same number of the bits as the first unlock signal sequence.

5. The serial memory device of claim 1, wherein the second unlock signal sequence comprises three bytes of data; the first byte provides an unlock code, the second byte sets word address, and the third byte sets data.

6. The serial memory device of claim 1, wherein the control logic receives a lock signal sequence from the serial data access pin and generate a lock command signal for the write-protection circuit block to set the protection state to lock state in the security area.

7. The serial memory device of claim 1, wherein the lock signal sequence comprises three bytes of data; the first byte provides a lock code, the second byte sets word address, and the third byte sets data.

8. A method of unlocking a serial non-volatile memory device comprising:

(i) applying a first designated unlock signal sequence to one of address input pins or a logic low enabled write-protection input pin ($\overline{WP}$) of the memory device; wherein the first unlock sequence has 1-7 signal bits;

(ii) applying a second unlock signal sequence to a serial data access pin of the memory device.

9. The method of claim 8, wherein the first unlock signal sequence is consisted of 4 signal bits.

10. The method of claim 8, wherein the unlock signal sequences further include a first SDA unlock signal sequence applied on the SDA pin during the same clock sequence period as the first unlock signal sequence applied to one of the address input pins or a logic low enabled write-protection input pin (WP); wherein the first SDA unlock signal sequence has the same number of the bits as the first unlock signal sequence.

11. The method of claim 8, wherein the second unlock signal sequence comprises three bytes of data; the first byte provides an unlock code, the second byte sets word address, and the third byte sets data.

* * * * *